(12) United States Patent
Wilcox et al.

(10) Patent No.: US 9,470,756 B1
(45) Date of Patent: Oct. 18, 2016

(54) METHOD FOR USING SEQUENTIAL DECOMPRESSION LOGIC FOR VLSI TEST IN A PHYSICALLY EFFICIENT CONSTRUCTION

(71) Applicant: Cadence Design Systems, Inc., San Jose, CA (US)

(72) Inventors: Steev Wilcox, San Jose, CA (US); Brian Edward Foutz, Charlottesville, VA (US); Krishna Vijaya Chakravadhanula, Vestal, NY (US); Vivek Chickermane, Slaterville Springs, NY (US); Paul Alexander Cunningham, Mountain View, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/738,765

(22) Filed: Jun. 12, 2015

(51) Int. Cl.
  *G01R 31/28* (2006.01)
  *G01R 31/3177* (2006.01)
(52) U.S. Cl.
  CPC ................ *G01R 31/3177* (2013.01)
(58) Field of Classification Search
  CPC ................. G01R 31/3177; G01R 31/318547; G01R 31/2889
  USPC ....................................... 714/726
  See application file for complete search history.

(56) References Cited

U.S. PATENT DOCUMENTS

| | | | |
|---|---|---|---|
| 7,610,540 B2 | 10/2009 | Balakrishnan et al. | |
| 7,647,540 B2 | 1/2010 | Rajski et al. | |
| 7,823,034 B2 | 10/2010 | Wohl et al. | |
| 7,840,865 B2 | 11/2010 | Lai et al. | |
| 7,930,607 B2 | 4/2011 | Sinanoglu | |
| 8,479,067 B2 | 7/2013 | Chandra et al. | |
| 8,832,512 B2 | 9/2014 | Czysz et al. | |
| 8,887,018 B2 * | 11/2014 | Narayanan | G01R 31/31854 714/729 |
| 8,914,695 B2 | 12/2014 | Gizdarski | |
| 2010/0318863 A1 * | 12/2010 | Whetsel | G01R 31/31854 714/726 |
| 2010/0318866 A1 * | 12/2010 | Whetsel | G01R 31/3177 714/733 |
| 2012/0096324 A1 * | 4/2012 | Whetsel | G01R 31/3177 714/731 |
| 2012/0324305 A1 * | 12/2012 | Whetsel | G01R 31/31853 714/733 |
| 2015/0234009 A1 * | 8/2015 | Whetsel | G01R 31/3177 714/727 |
| 2015/0276871 A1 | 10/2015 | Ren et al. | |
| 2016/0169971 A1 * | 6/2016 | Oomman | G01R 31/3177 714/726 |

* cited by examiner

*Primary Examiner* — David Ton
(74) *Attorney, Agent, or Firm* — Kenyon & Kenyon LLP

(57) ABSTRACT

Methods, systems, and integrated circuits for decompressing a set of scan input data in a Design for Test (DFT) application, in which implementation may include determining a number of scan inputs to applied circuit from automated test equipment (ATE). Based on the number of scan inputs, another aspect of implementation may involve generating a 2-dimensional grid on the integrated circuit (IC). Another implementation aspect may involve decompressing the scan inputs from the ATE according to decompression logic that is sequentially distributed such that the grid can locally apply the last stage of the decompression logic. In accordance with aspects of the method, the physical structure of an IC decompression logic is more accessible to individual scan chains and reduces congestion on board the IC.

20 Claims, 12 Drawing Sheets

METHOD FOR USING SEQUENTIAL DECOMPRESSION LOGIC FOR VLSI TEST IN A PHYSICALLY EFFICIENT CONSTRUCTION

TECHNICAL FIELD

The present invention relates to methods, systems, and computer-readable media for testing integrated circuit designs; the invention also relates to an integrated circuit implementing a physically efficient construction for distributing test decompression logic.

CROSS-REFERENCE TO RELATED APPLICATIONS

This application is being filed concurrently with U.S. patent application Ser. No. 14/738,763, entitled "Method for Using XOR Trees for Physically Efficient Scan Compression and Decompression Logic," and with U.S. patent application Ser. No. 14/738,746, entitled "Method for Dividing Testable Logic into a 2-Dimensional Grid for Physically Efficient Scan," both of which are incorporated herein by reference in their entireties.

BACKGROUND

Modern integrated circuits ("ICs") in production require an enormous volume of components. Testing of those ICs requires a large number of test patterns. Transition fault testing has become more prominent, requiring many times more patterns than before. As the chip size and the ratio of logic to be tested per input/output test pin increases dramatically, the amount of data necessary to be supplied by techniques such as automatic test pattern generation ("ATPG") has become voluminous. Design for test ("DFT") designers are faced with the challenge of inputting, for each of these large chips, a huge volume of scan test sequences via a minimal number of test pins. Therefore, with ATPG only, the required test time increased and the required amount of tester memory increased, both of which increased cost associated with DFT.

In order to address these challenges, DFT designers have used a technique called Test Compression. Test Compression reduces test data volume and test application time ("TAT") while retaining test coverage. Using Test Compression, highly compressed scan chains can be applied to low-pin count automated test equipment ("ATE"), which decompress the scan chains to a large number of scan channels that apply data directly to the IC. After applying the scan chain data to the IC, the data is then compressed for measurement and comparison. Test Compression recognizes that only a small percentage of scan cells in a scan chain ("care bits") generated by ATPG are necessary for testing. Test Compression modifies the design to apply the care bits in shorter scan chains, reducing the TAT. The compression ratio generated by Test Compression methods is capable of greatly reducing the test data volume and TAT. For example, original data having a volume of 6 Gb and TAT of 20 seconds is, at a 100× compression ratio, reduced by 99% to 60 Mb and TAT of 0.2 seconds.

Test Compression is driven by two structures: a Decompressor and a Compressor (or Compactor). The Decompressor drives the test stimuli onto the IC from the small number of scan-in pins on the ATE to the large number of internal scan channels which are applied to the IC. The Decompressor is designed to allow a continuous flow of stimuli so that it is possible to load the scan chain data for a given test onto the IC and to unload from the IC the previous test response data to the Compressor, all in a single clock cycle. Compression and De-compression logic generally are built using discrete logic gates such as XORs, multiplexers and flip-flops and placed inside a logic module called CoDec which is normally placed in one corner of the IC. Wires transfer test stimuli from the DeCompressor inside the CoDec to the head of the scan channels which may be distributed across the area of the IC. Similarly wires from the tails of the scan channels transfer the test stimuli to the Compressor inside the CoDec.

To form the connections to and from the decompression and compression logic, wires need to be run from every component under test to the decompression and compression logic. Wiring all of these connections directly between the scan chains scattered over the surface area of the IC and the decompression and compression logic is referred to as traditional global scan wiring. To reduce the cost of testing ICs DFT engineers try to build more scan chains of shorter length to increase the compression ratio. Higher compression ratios means that there are more wires running from the CoDec to the heads and tails of the shorter and more numerous scan chains, The additional wiring increases the footprint of the IC and may lead to wiring congestion. The result is congestion in the area directly around the decompression logic and compression logic, and the use of extremely long wires to form some of the connections. For compression ratios exceeding 100×, congestion is extreme since there is a large number of wires terminating and originating from a small area of compression logic. As the compression ratios increase, due to better compression algorithms, traditional global placement of logic is no longer appropriate. Other methods have been introduced in efforts to correct the on-board congestion issues associated with compression logic, such as XOR mapping and partitioned Compressor-Decompressors. However, XOR mapping and partitioned Compressor-Decompressor methods are at best incremental improvements.

As chip complexity increases, compression ratios have to increase. However physical chip layout can prevent implementation of the large compression ratios. At a certain point, the total number of wires that can be manufactured in contact with on-board location of the decompression logic and compression logic presents a bottleneck.

DESCRIPTION OF EMBODIMENTS

Figure 1:
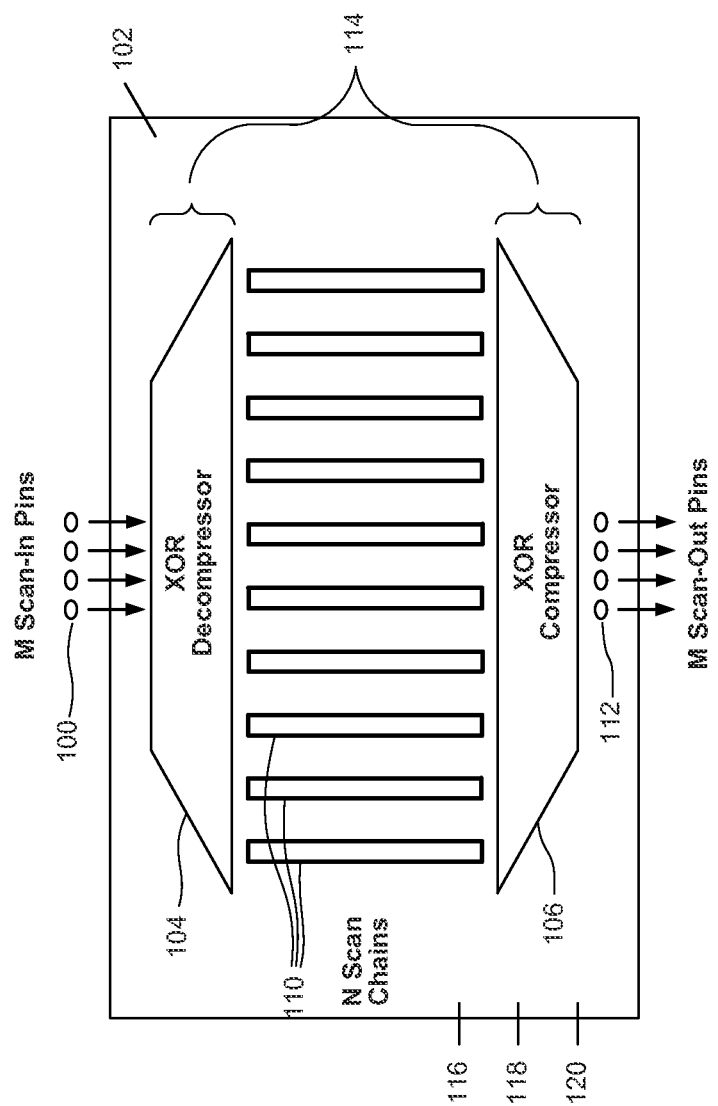
FIG. 1 illustrates application of test stimuli from an ATE to an IC using a Decompressor, which transfers compressed test data from M scan-in pins into uncompressed test data that can be loaded into N scan chains, and unloading of response data after the test application using a Compressor, which compresses the test response from N scan chains to M scan-out pins.

The following description of embodiments provides non-limiting representative examples referencing numerals to particularly describe features and teachings of the invention. The embodiments described should be recognized as capable of implementation separately, or in combination, with other embodiments from the description of the embodiments. A person of skill in the art reviewing the description of embodiments should be able to learn and understand the different described aspects of the invention. The description of embodiments should facilitate understanding of the invention to such an extent that other implementations of the invention, not specifically covered but within the knowledge of a person of skill in the art having read the description of embodiments, would be understood to be consistent with an application of the invention.

One aspect of the present disclosure is to provide systems, device configurations, and methods for testing integrated circuit design using distributed decompression logic. The methods and apparatuses herein address at least one of the test decompression problems described above. Accordingly, distributed sequential decompression logic for use in a physically efficient construction of the IC is provided.

In one embodiment, the distributed sequential decompression logic is implemented on a design for test integrated circuit capable of decompressing a set of scan inputs for a test, the design for test integrated circuit comprising: a 2-dimensional grid of the integrated circuit having a first set of wires, each wire in the first set of wires extending along a first dimension of the grid, and a second set of wires that crosses the set of first wires, each wire in the second set of wires extending along a second dimension of the grid; selection logic that: generates a first set of terms and a second set of terms from the set of scan inputs, assigns each of the generated terms from the first set of terms to different wires in the first set of wires, and assigns each of the generated terms from the second set of terms to different wires in the second set of wires; a set of exclusive OR (XOR) gates, each XOR gate from the set of XOR gates placed in a different region of the integrated circuit in which a wire in the first set of wires crosses a wire in the second set of wires, and each XOR gate input connected to: (i) the wire in the second set of wires and (ii) the wire in the first set of wires, and each XOR gate output connected to at least one scan chain.

The first set of terms and the second set of terms can be selected in various ways. A designer can designate a term from the scan inputs as a term in one of the first set of terms or the second set of terms. In some embodiments, the designation of terms from the scan inputs is implemented by routing logic, selection pins, or other equivalent hardware. In some embodiments, all possible terms from the scan inputs are designated as terms in either the first set of terms or the second set of terms. In one embodiment, not all of the possible terms from the scan inputs are designated in the first set of terms and the second set of terms.

In some embodiments, the distributed sequential decompression logic is referred to as a distributed Decompressor. The Decompressor is constructed by dividing the input pins into a $2^p$ by $2^q$ 2-dimensional grid where p and q are both integers greater than zero. Therefore, when there are N input bits from the test scan inputs during each clock cycle, there are $2^N$ different total term combinations that are eligible for designation to test from the N input bits during the current cycle. From those $2^N$ different total term combinations, there are $2^{N-1}$ even term combinations and $2^{N-1}$ odd term combinations ($2^{N-1}+2^{N-1}=2^N$).

Odd term combinations and even term combinations refer to subsets of the total terms that can be generated from a set of N input bits. The total number of term combinations that can be generated from the N inputs bits is $2^N$ different total term combinations. For example, if the three input bits include the set of {a, b, c}, the total number of term combinations is the 8 terms: {0, a, b, c, a^b, a^c, b^c, a^b^c}. The even terms combinations from the total number of term combinations includes all terms that have an even number of the original N input bits in them. In the example where N=3, the even term combinations include: {0, a^b, a^c, b^c}. The odd term combinations from the total number of term combinations includes all terms that have an odd number of the original N input bits in them. In the example where N=3, the odd term combinations include: {a, b, c, a^b^c}. When an even term is combined with an odd term, the result of the combination is consistently an odd term. In an embodiment, the design for test integrated circuit is structured such that all of the even terms are combined with all of the odd terms through a set of XOR gates to generate a set of grid terms including every odd term combination possible from the N input bits.

To structure the design for test integrated circuit according to an embodiment, one of p or q may be set such that the even terms are fed along a first side of the grid during the current clock cycle. The first side of the grid refers to a first set of wires included in the grid that each extend along a first dimension of the grid. The other of p or q is set such that the odd terms are fed along a second side of the grid. The second side of the grid refers to a second set of wires included in the grid that each extend along a second dimension of the grid. Accordingly, in an embodiment in which all of the even or odd terms are designated as terms in the first set of terms and the second set of terms, respectively, the number of input pins on the p-side (where p=N−1) of the grid is $2^{N-1}$, and the number of input pins on the q-side (where q=N−1) of the grid is $2^{N-1}$. The inputs on a first side of the grid are formed by applying all of the odd terms to the first set of wires. The second set of wires on the second side of the grid receives all of the even terms.

In some embodiments, in order to latch the first set of terms and second set of terms onto the first and second sides of the grid, a cyclic shift register, which is a sequential register element, is implemented along each of the sides of the grid. One of the cyclic shift registers latches all of the first set of terms onto the grid, and the other of the cyclic shift registers latches all of the second set of terms onto the grid. By latching the output of these sequential elements, the second set of terms and the first set of terms are driven onto the horizontal and vertical axes of the grid.

Figure 8:
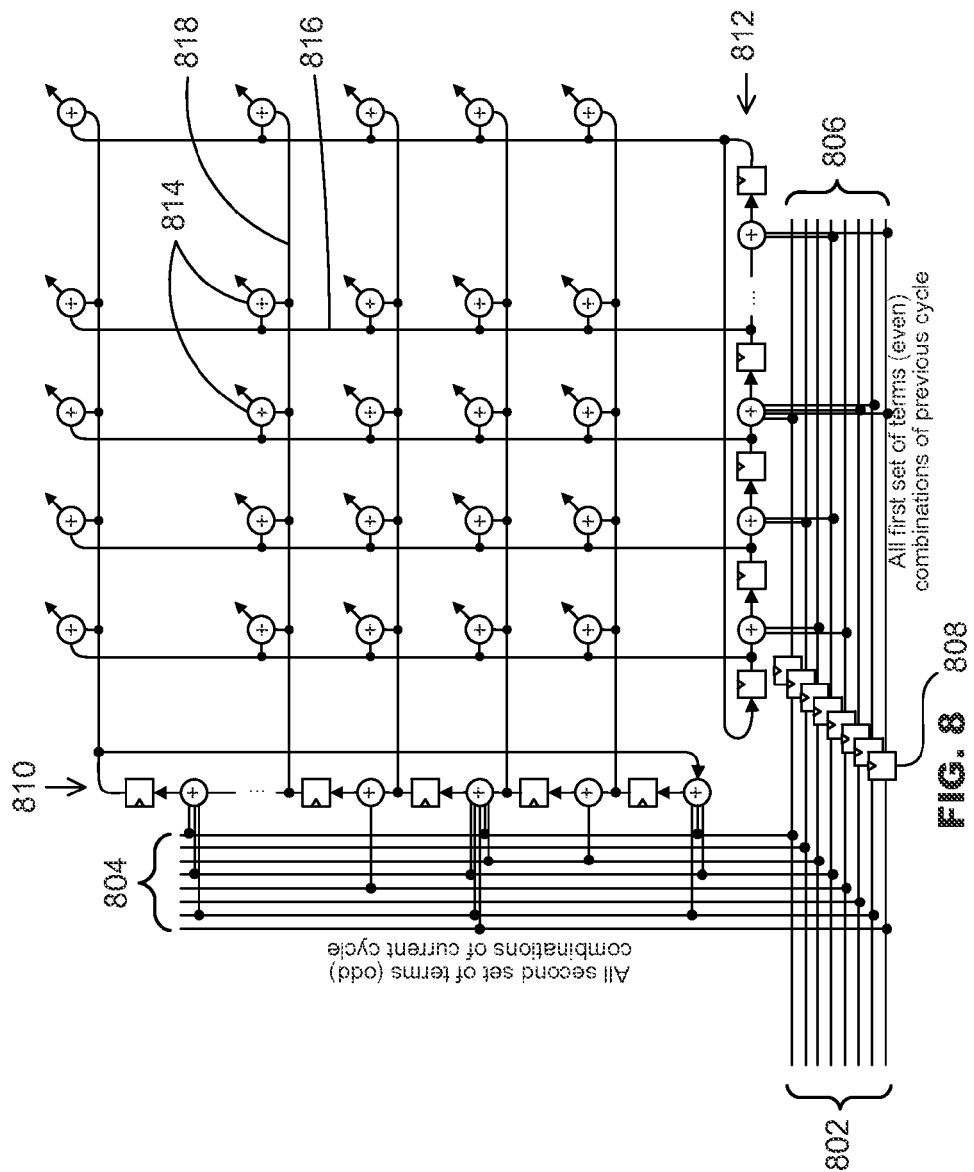
FIG. 8 illustrates an IC input and XOR placement schema of the decompression logic of FIG. 7.

In some embodiments, and as depicted in FIG. 8, the term combinations from the first set of terms are introduced into a cyclic shift register by including the output of an XOR in the cyclic shift register. For example, a second set of XOR gates (e.g., as the XOR gates included in 812) is included in the integrated circuit that receives the set of scan inputs and generate all second set of terms from the set of scan inputs. In doing so, a first cyclic shift register collects all of the output from the second set of XOR gates, applies a flop delay, and then latches the collected output from the XOR gates onto the first set of wires in the 2-dimensional grid.

In some embodiments, the first cyclic shift register (e.g., 812) latches the collected output onto the first set of wires by driving the output from the second set of XOR gates directly onto the set of first wires on the 2-dimensional grid. In other embodiments, the first cyclic shift register latches the collected output onto the first set of wires by driving the output through a first set of memory elements associated with the second set of XOR gates and then onto the first set of wires on the 2-dimensional grid. The first cyclic shift register could further be structured such that the register latches the collected output onto the first set of wires by driving the output from both the second set of XOR gates and the first set of memory elements associated with the second set of XOR gates onto the first set of wires. The cyclic shift register has in some embodiments a shift register connected to the output of each XOR gate along a shift path of the cyclic shift register. In some embodiments, the first cyclic shift register is a first in, first out ("FIFO") cyclic shift register. In other embodiments, the first cyclic shift register includes tap back points that changes the shift register into a pseudo-random pattern generator shift register ("PRPG") based implementation.

In some embodiments, the second set of term combinations are introduced into a cyclic shift register by including the output of an XOR in the cyclic shift register. For example, a third set of XOR gates (e.g., as the XOR gates included in 810) is included in the integrated circuit that receive the set of scan inputs and generate the second set of terms from the set of scan inputs. Thereafter, a second cyclic shift register collects all of the output from the third set of XOR gates and latches the collected output from the XOR gates onto the second set of wires in the 2-dimensional grid.

In some embodiments, and as depicted in FIG. 8, the second cyclic shift register (e.g., 810) latches the collected output onto the second set of wires by driving the output from the third set of XOR gates directly onto the set of second wires on the 2-dimensional grid. In other embodiments, the second cyclic shift register latches the collected output onto the second set of wires by driving the output from a second set of memory elements associated with the third set of XOR gates onto the second set of wires on the 2-dimensional grid. The second cyclic shift register could further be structured such that the register latches the collected output onto the second set of wires by driving the output from both the third set of XOR gates and the second set of memory elements associated with the third set of XOR gates onto the second set of wires. The cyclic shift register has in some embodiments a shift register connected to the output of each XOR gate along a shift path of the cyclic shift register. In some embodiments, the second cyclic shift register is a first in, first out ("FIFO") cyclic shift register. In other embodiments, the second cyclic shift register includes tap back points that changes the shift register into a pseudo-random pattern generator shift register ("PRPG") based implementation.

In some embodiments, the axes associated with the second set of terms and the first set of terms are switched when the second set of terms are maintained at the current clock cycle and the first set of terms are maintained at the previous clock cycle. In some embodiments, the second set of terms are pushed to the scan chains at the previous clock cycle and the first set of terms are pushed to the scan chains at the current clock cycle. Delay of the scan input is introduced by a delay circuit element. In an embodiment, a delay circuit element is a delay flop. The delay implemented on one of the first set of terms and the second set of terms can furthermore be implemented over more than one clock cycle. To introduce the clock cycle delay, in some embodiments, a set of delay flops are introduced along either the p axis or the q axis of the scan inputs. In another construction of the integrated circuit, a set of delay flops is introduced along both of the p axis and q axis of the scan inputs such that the grid is flexible to implement delays along either axis. In an embodiment, the clock cycle delay is only one clock cycle. In an embodiment, the clock cycle delay is more than one clock cycle. In other embodiments, there is no clock cycle delay. The delay flops hold the scan input data over a predetermined number of clock cycles and push the scan input data out at one of the rising or falling edge of the clock cycle such that there is a clock cycle delay.

In some embodiments, the output from each XOR gate from the set of XORs overlaid over the different regions of the integrated circuit is connected to only one scan chain in the corresponding grid cell. In other embodiments, the output from each XOR gate from the set of XORs overlaid over the different regions of the integrated circuit is connected to multiple scan chains the corresponding grid cell. In some embodiments, the output from some of the XOR gates from the set of XORs overlaid over the different regions of the integrated circuit is connected to multiple scan chains the corresponding grid cell and the output from some of the XOR gates from the set of XORs overlaid over the different regions of the integrated circuit is connected to only one scan chain. When the output from an XOR gate from the set of XORs overlaid over the different regions of the integrated circuit is connected to multiple scan chains, the output is provided to each of the scan chains by a local broadcast of the output data.

In some embodiments, the grid described in accordance with any of the foregoing examples is mimicked on a larger scale to a larger area in which $2^p$ is increased by an integer factor, r, to size $r*2^p$ and $2^q$ is increased by an integer factor, s, to size $s*2^q$.

In yet another aspect, a method for implementing sequential decompression logic in a design for test integrated circuit comprises: determining a number of scan inputs in the set of scan inputs; generating a 2-dimensional grid on an integrated circuit, the 2-dimensional grid having: a set of first wires, each wire in the set of first wires extending along a first dimension of the grid, and a set of second wires, crossing the set of first wires, each wire in the set of second wires extending along a second dimension of the grid; generating a first set of terms and a second set terms for the set of scan inputs; loading the set of scan inputs onto the integrated circuit using the 2-dimensional grid by: assigning each of the generated first set of terms to different wires in the set of first wires, assigning each of the generated second set of terms to different wires in the set of second wires, and in each region where a wire in the set of first wires crosses a wire in the set of second wires: combining a term from the second set of terms assigned to the wire in the set of second wires with a term from the first set of terms assigned to the wire in the set of first wires into a grid term, and applying the grid term to a local area of the integrated circuit.

In some embodiments of the method, the first dimension of the grid is set such that it is perpendicular to the second dimension of the grid. In other embodiments, the first dimension of the grid is not perpendicular to the second dimension of the grid, yet the set of first wires and the set of second wires still cross, providing grid regions in the areas between the crossed regions.

In accordance with one aspect of the method, combining the second set of terms from the wire in the second set of wires with the first set of terms from the wire in the first set of wires into the grid term is performed by providing the second set of terms and the first set of terms as input to an XOR gate and receiving the grid term as output from the XOR gate.

In some embodiments, the method further implements a delay of at least one clock cycle to one of the generated terms from the first set of terms and the generated terms from the second set of terms. By implementing the delay, the assignment of the generated terms is delayed by the at least one clock cycle. In some embodiments, the delay is implemented before assigning one of the generated first set of terms and the generated second set of terms to their respective wires along the 2-dimensional grid. In some embodiments, the delay is implemented as part of a sequential shift register located along one of the axes of the grid after the assignment of one of the generated first set of terms and the generated second set of terms is completed. In some embodiments, multiple delays are implemented, with one delay implemented before assigning one of the generated first set of terms and the generated second set of terms to their respective wires along the 2-dimensional grid, and with another delay implemented as part of a sequential shift register located along one of the axes of the grid.

The assignment of the generated first set of terms as part of one aspect of the method comprises: applying the set of scan inputs to a first set of exclusive OR (XOR) gates, such that the output of the set of XOR gates includes all of the first set of terms; collecting the output from the first set of XOR gates in a first cyclic shift register, and latching the collected output from the first cyclic shift register onto the set of first wires on the 2-dimensional grid. The assignment of the generated second set of terms as part of the method comprises: applying the set of scan inputs to a second set of XOR gates, such that the output of the second set of XOR gates includes all of the second set of terms; collecting the output from the second set of exclusive OR (XOR) gates in a second cyclic shift register, and latching the collected output from the second cyclic shift register onto the set of second wires on the 2-dimensional grid.

The latching of the collected output from the first cyclic shift register as part of the method is implemented by one of driving the output from the first set of XOR gates onto the set of first wires on the 2-dimensional grid, and driving the output from a first set of memory elements associated with the first set of XOR gates onto the first set of wires on the 2-dimensional grid. The latching of the collected output from the second cyclic shift register as part of the method is implemented by one of: driving the output from the second set of XOR gates onto the set of second wires on the 2-dimensional grid, and driving the output from a second set of memory elements associated with the second set of XOR gates onto the second set of wires on the 2-dimensional grid.

In some embodiments the first cyclic shift register and the second cyclic shift register are each a first-in, first-out (FIFO) cyclic shift register. In some embodiments, the first cyclic shift register and the second cyclic shift register are each a pseudo-random pattern generator shift register (PRPG). In other embodiments, one of the first cyclic shift register and the second cyclic shift register is a FIFO and the other is a PRPG.

In one embodiment, the system for decompressing a set of scan inputs comprises: a 2-dimensional grid having a first set of wires, each wire in the first set of wires extending along a first dimension of the grid, and a second set of wires that crosses the first set of wires, each wire in the second set of wires extending along a second dimension of the grid; a design for test integrated circuit in a plane parallel to the 2-dimensional grid, the design for test integrated circuit having: a set of XOR gates, with each XOR gate from the set of XOR gates in a different region of the integrated circuit parallel to locations on the 2-dimensional grid in which a wire from the first set of wires crosses a wire in the second set of wires, with each XOR gate input connected to: (i) the wire in the second set of wires and (ii) the wire in the first set of wires, and at least one scan chain associated with each XOR gate output; and selection logic driving: (i) each even term of all even terms associated with the set of scan inputs to different wires in the first set of wires, and (ii) each odd term of all odd terms associated with the set of scan inputs to different wires in the second set of wires, wherein the first axis is perpendicular to the second axis.

In some embodiments of the system including the integrated circuit, the system is implemented such that the 2-dimensional grid is overlaid onto the design for test integrated circuit. In other embodiments of the system, the system is implemented such that the 2-dimensional grid is applied to the design for test integrated circuit by temporary means, such as an interlocking pin placement. In the system, in some embodiments the grid is not symmetric and therefore, p does not equal q. In other embodiments, the grid used in the system is symmetric and p equals q. The grid applied to the integrated circuit is not necessarily the same size as the surface area of the integrated circuit. In some embodiments, the grid covers the surface area of the integrated circuit. In other embodiments, the grid covers a surface area that is less than the full surface area of the integrated circuit.

The locations in which the XOR gate provides output to regions of the IC are in some circumstances selected such that the XOR output, or the grid term, is in close proximity to the scan chain. In some embodiments, the locations are selected such that they are in the center of regions defined by the grid cells. In some embodiments, the location of the XOR output, or the grid term, is selected according to a designer's location selection within each grid cell. In other embodiments, in which there is more than one scan chain per grid cell, the location of the XOR output, or the grid term, is selected such that it is central to all of the scan chains in the respective grid cell. In some other embodiments, in which there is more than one scan chain per grid cell, the location of the XOR output, or the grid term, is selected according to a designer's location selection within each grid cell.

To implement a test as part of a DFT, a test pattern including test stimuli, must be applied to the IC. When compression and decompression logic is implemented, the Decompressor is located between test input pins and scan chain heads and the Compressor is located between the scan chain tails and the test output pins. A scan clock is pulsed to shift the test patterns into the scan chains, and then the results are shifted out to the chip output pins. The test results from the DUT are then available for comparison against the expected results. The Decompressor is implemented on board the IC in order to expand the test data from a small number of input pins on the ATE to a larger number of scan chains on the IC. The Compressor is implemented on board the IC in order to compress the results data from a large number of scan chains on the IC to a smaller number of output pins on the ATE.

FIG. 1 illustrates application of test stimuli from an ATE to an IC using a Decompressor, which decompresses the compressed test stimuli from M scan-in pins into N scan chains, and compression of response data after the application using a Compressor, which transfers the stimuli from N scan chains into M scan-out pins. M scan-in pins 100 from the ATE are aligned with test patterns having test stimuli. When the mode 116 of the IC 102 is switched to "test mode", the test patterns are shifted onto, for a number of cycles associated with scan clock 118, the IC. The test patterns propagate through the XOR Decompressor 104 and populate register sets associated with the N scan chains 110. The test data is then stimulated, or tested, for a number of capture cycles associated with the functional clock 120. Then the test results are shifted out of the IC, for a number of cycles associated with scan clock 118. The test results propagate through the XOR Compressor 106 and out of the IC onto M scan-out pins 112. The test results are then held in the memory of ATE for comparison to the expected data. The Decompressor 104 connected between the scan in pins 108 and the scan chains 110 can be represented by an M to N directed acyclic graph (DAG). The Compressor 106 located between the scan chains 110 and the scan out points 112 is an N to M DAG. Collectively, the Compressor 104 and the Decompressor 106 comprise a CoDec 114.

Figure 2:
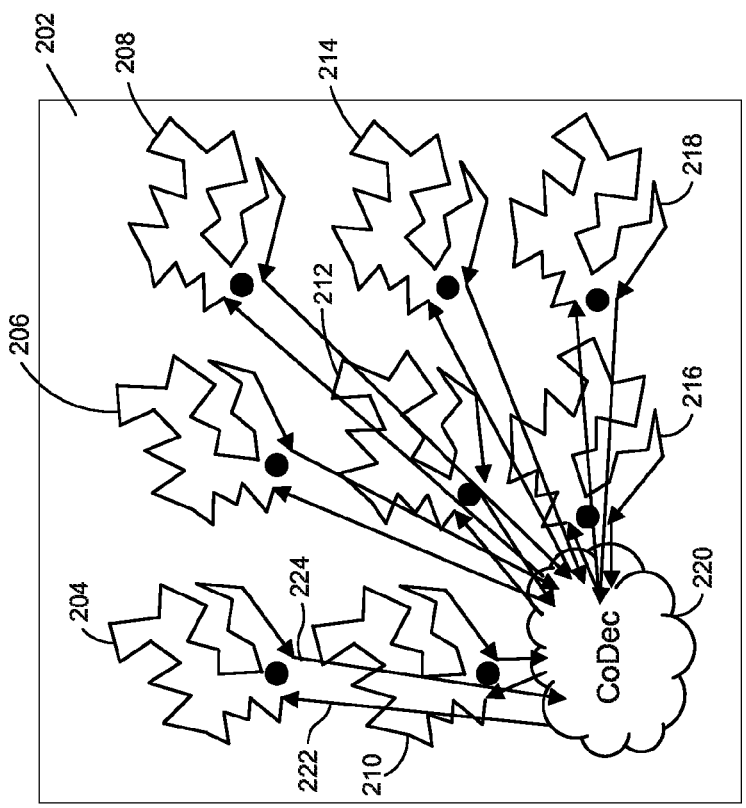
FIG. 2 illustrates an IC hosting DFT compression and decompression logic according to a global placement topology.

FIG. 2 illustrates an IC hosting DFT compression and decompression logic according to a global placement topology. IC 202 includes 8 different scan chains (204, 206, 208, 210, 212, 214, 216, 218) and CoDec 220. CoDec 220 includes the compression and decompression logic for the entire IC 202. Accordingly, before test data is loaded into each of the scan chains, it must pass through the CoDec 220. After the test data has been decompressed in the CoDec 220, it is routed to a corresponding portion of the IC and a respective scan chain. To perform this routing, wires (e.g., 222) connect from the Decompressor portion of CoDec 220 to the scan chains. After the test data has been stimulated, the test results return to the CoDec 220 for compression via wires (e.g., 224).

The area immediately surrounding the CoDec 220 becomes congested as the number of wires from the scan chains increases. The shorter the scan chains, the more total wire length needed to connect to and from the CoDec 220. Overall, the total chain length is independent of the number of scan chains. As the compression ratio implemented by the CoDec increases, the length of each scan chain (e.g., 204) decreases. However, as each scan chain is shortened, the total number of scan chains increases, and the wire length to and from the scan chains to the CoDec increases. In these circumstances, the result is that at least some of the test data travels over long wires in order to be compressed and decompressed. Therefore, as compression ratios improve, complex wiring from the scan chains to the CoDec result.

Figure 3:
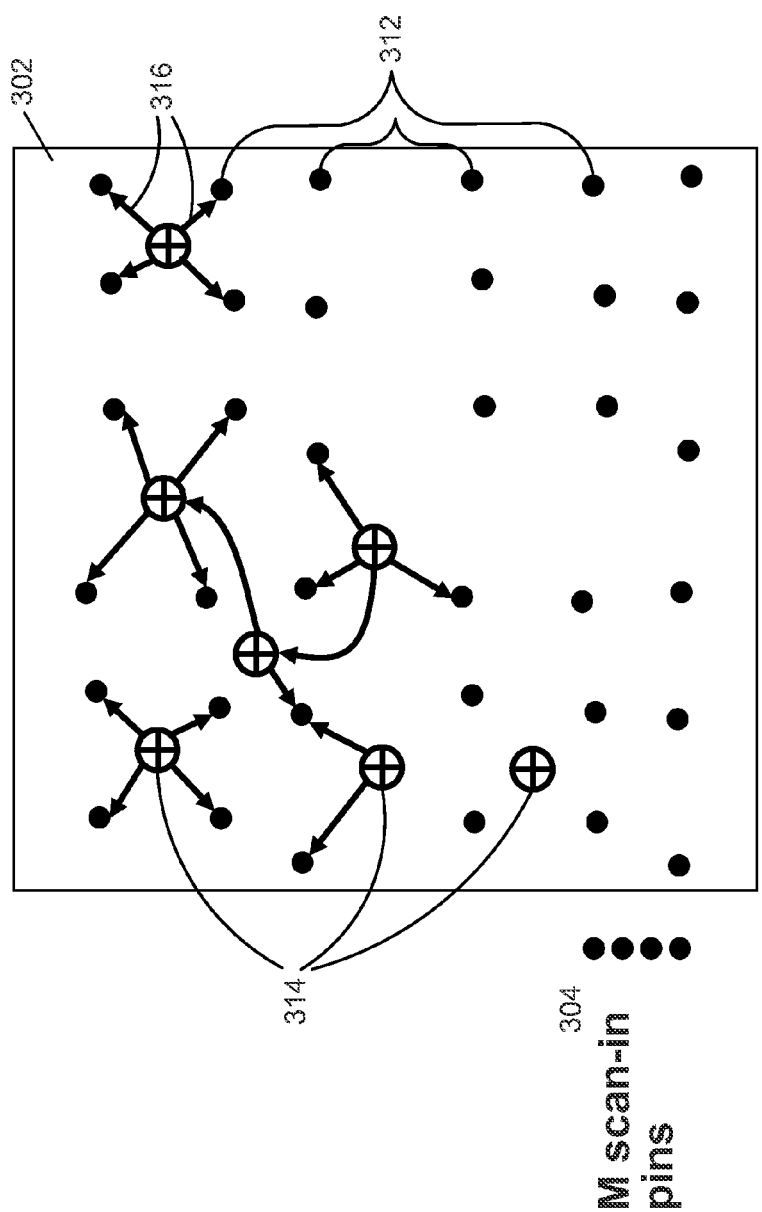
FIG. 3 illustrates distribution of the decompression logic over the 2-dimensional IC by placement of XOR gates involved in the decompression logic over the chip area.

FIG. 3 illustrates distribution of the decompression logic over the 2-dimensional IC by placement of XOR gates involved in the decompression logic over the chip area. One aspect of the present invention enables provision of less complex wiring while implementing a high decompression ratio. Accordingly, an aspect of an embodiment includes a physically distributed Decompressor that reduces wire length and minimizes congestion. FIG. 3 illustrates an IC 302 that has M scan-in pins 304, which provide the IC 302 with the test stimuli via test patterns. The IC 302 includes N scan channel nodes 312 that are available for application of the test stimuli. In order to feed all of the N scan channel nodes 312 discrete XOR gates 314 are distributed throughout the surface of the IC 302 for ease of forming wire connections between the N scan channel nodes 312 and the discrete XOR gates 314. In FIG. 3, on the surface of the IC 302, only some of the N scan channel nodes 312 are labeled, but it should be understood that the labeling is limited for clarity, and that 312 refers to all of the presented N scan channel nodes on the surface of IC 302. When placing XOR gates, it should be understood that different schemes can be used to partition an IC for distribution of test stimuli and test patterns. Partitioning the IC can be performed according to 1-dimensional or 2-dimensional structures. The method, device, and system described herein are specifically provided with regard to a 2-dimensional distribution structure.

Figure 4:
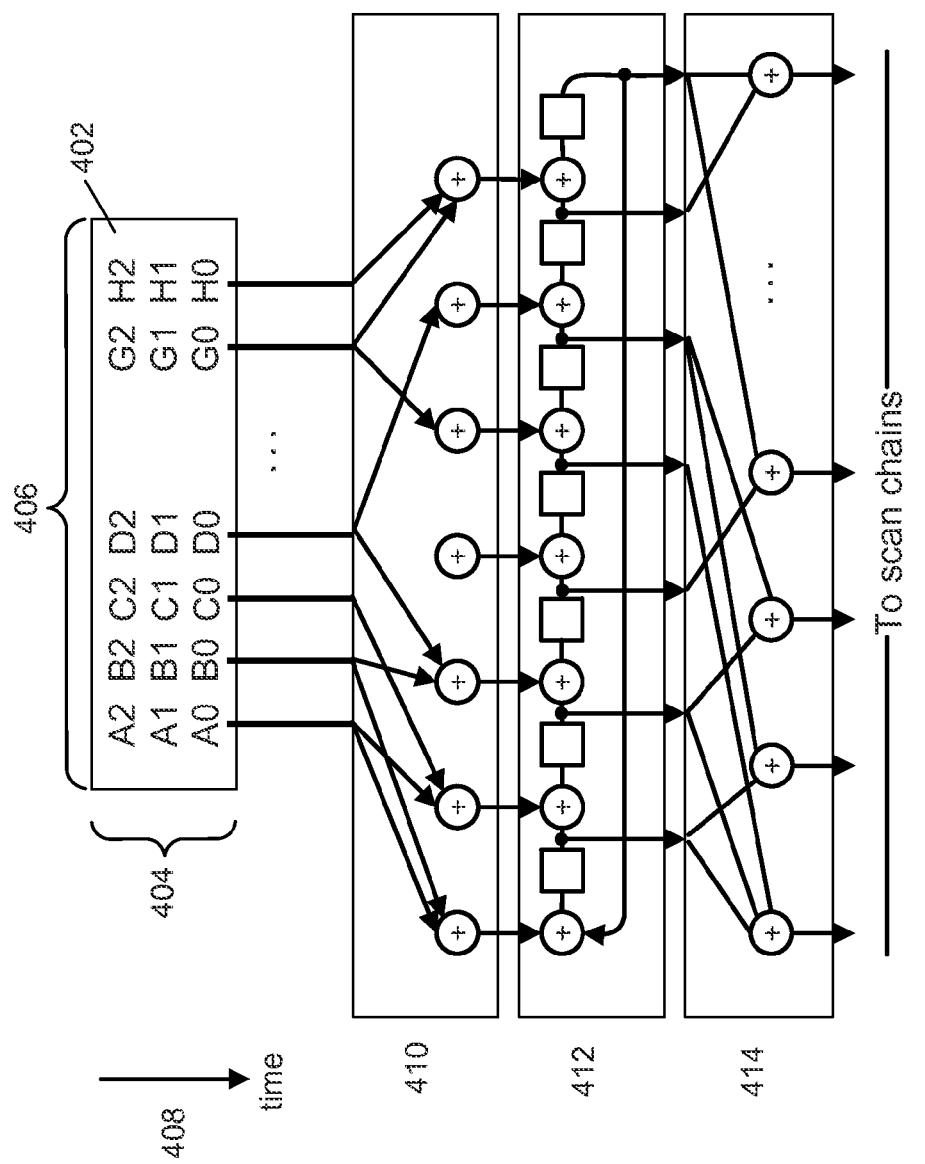
FIG. 4 illustrates a generalized sequential Decompressor.

FIG. 4 illustrates a generalized sequential Decompressor. A generalized sequential Decompressor accepts scan inputs through M scan in pins (406). Over time 408, the scan input data 402 are loaded into a scan distribution network (e.g., 410, 412, 414). As is further shown in FIG. 4, scan input data 402 have a test data depth 404 and a number of terms equal to the number of scan in pins 406. The scan inputs are fed in N terms, where in this instance, N=8, at a time through N scan in pins. As time 408 passes, and with each clock cycle, another N terms are fed in through the N scan in pins. The loading cycles continue until all of the scan inputs have been loaded into the decompression logic. A scan chain has a depth that is consistent with the test data depth 404. In the example shown in FIG. 4, the test data depth is 3 terms deep. For maximum efficiency, then, in this example scan chains to be loaded on the IC should have a depth of 3 registers. However, before the test data is relayed to the registers on the IC, the scan inputs are subjected to a series of layers that perform the decompression logic and expand the number of terms available for test throughout the IC. In a first layer, which is a scan distribution network 410, the test data is expanded into additional terms. The scan distribution network 410 includes a plurality of XOR gates, some of which receive a single input from the test data at each clock cycle, and some of which receive multiple inputs from the test data at each clock cycle. The output of the plurality of XOR gates from the scan distribution network layer 410 is then loaded into a sequential layer 412. In an embodiment, the sequential layer may be a pseudo-random pattern generator shift register ("PRPG"). In another embodiment, the sequential layer 412 may be a cyclic shift register, such as a first in, first out ("FIFO") register.

Outputs of sequential layer 412 pass to a generalized sequential Decompressor 414, which in an embodiment may have a plurality of XOR gates. Implementation of the generalized sequential Decompressor 414 does not take into consideration the physical impacts of the structure. As a result, the generalized sequential Decompressor 414 presents itself on an IC as a localized physical macro, in a single location on the IC. The generalized sequential Decompressor 414 does not distribute its final logical level and so does not track distribution of decompression logic over the surface of an IC. Accordingly, the implementation of the generalized sequential Decompressor 414 can create physical congestion and bottleneck issues that were previously described.

Figure 5:
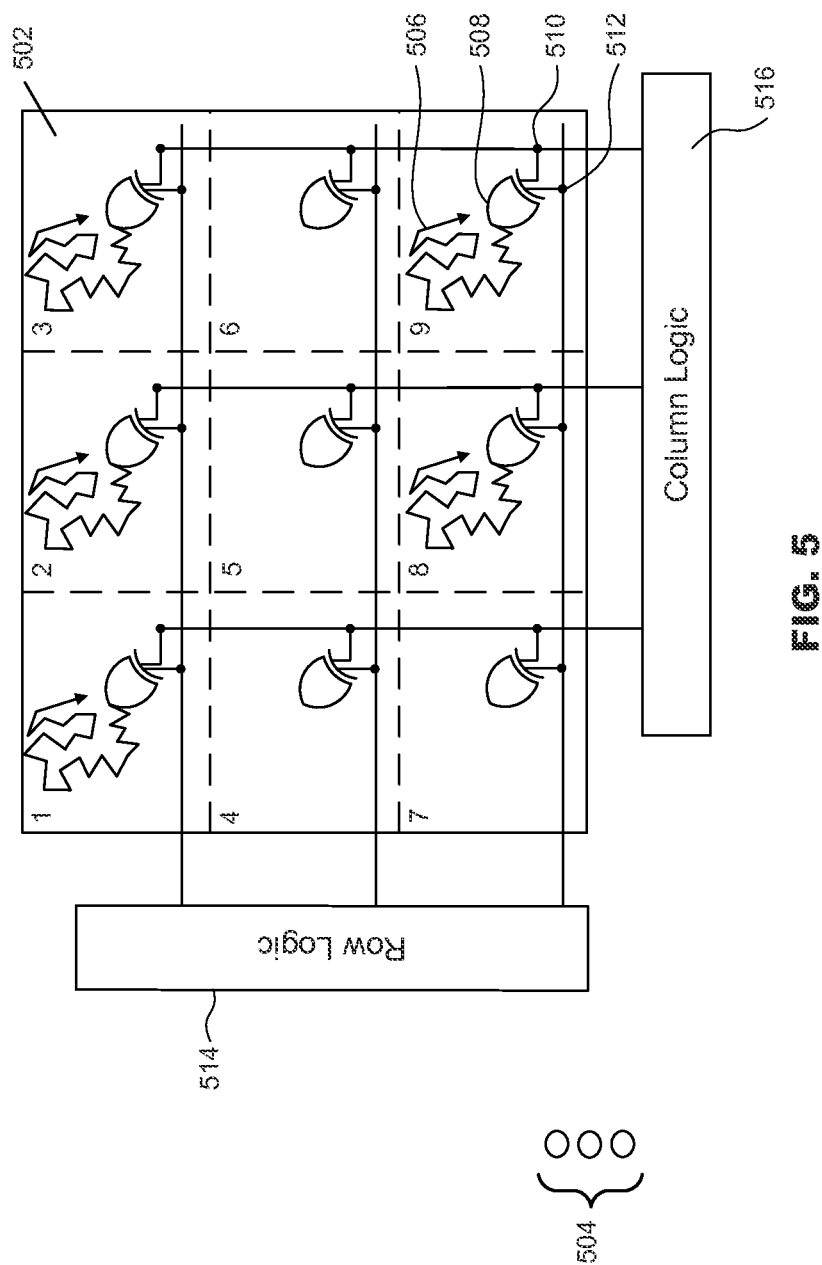
FIG. 5 illustrates an embodiment of an IC having a distributed Decompressor as part of its CoDec.

FIG. 5 illustrates an embodiment of an IC having a distributed Decompressor, as part of its CoDec. In FIG. 5, IC 502 is partitioned into a number of regions (1, 2, 3, 4, 5, 6, 7, 8, 9). The distributed Decompressor allows for the IC 502 to be partitioned into a grid of Y by X boxes, with some of the decompression logic in each of the boxes. In IC 502 shown in FIG. 5, the grid is 3 boxes wide and 3 boxes long. In order to implement the distributed Decompressor, the final XOR stage is implemented so that there are localized XOR gates in each of the boxes. Each XOR, in each box, provides test stimuli from the M pins in 504 to the scan chains (e.g., 506) located within a respective box on the IC 502. Each XOR has a wire feeding from the horizontal direction (e.g., 512), from a row of decoding logic 514. Each XOR further has a wire feeding from the vertical direction (e.g., 510), from a column of decoding logic 516. The XOR (e.g., 508) then accepts the wire from the horizontal direction 512 and the wire from the vertical direction 510 as inputs into its gate 508. The output of the XOR is provided to its respective scan chain (e.g., 506) in the grid cell. In an embodiment, the grid cell includes more than one scan chain that receives the output of the XOR gate. In so doing, a unique piece of data is provided for each grid cell. The distribution of the XOR gates and the division of the grid, in an embodiment, covers the entire IC 502 area. In another embodiment, the distribution of the XOR gates and the division of the grid covers an area less than the entire IC 502 area.

Figure 6:
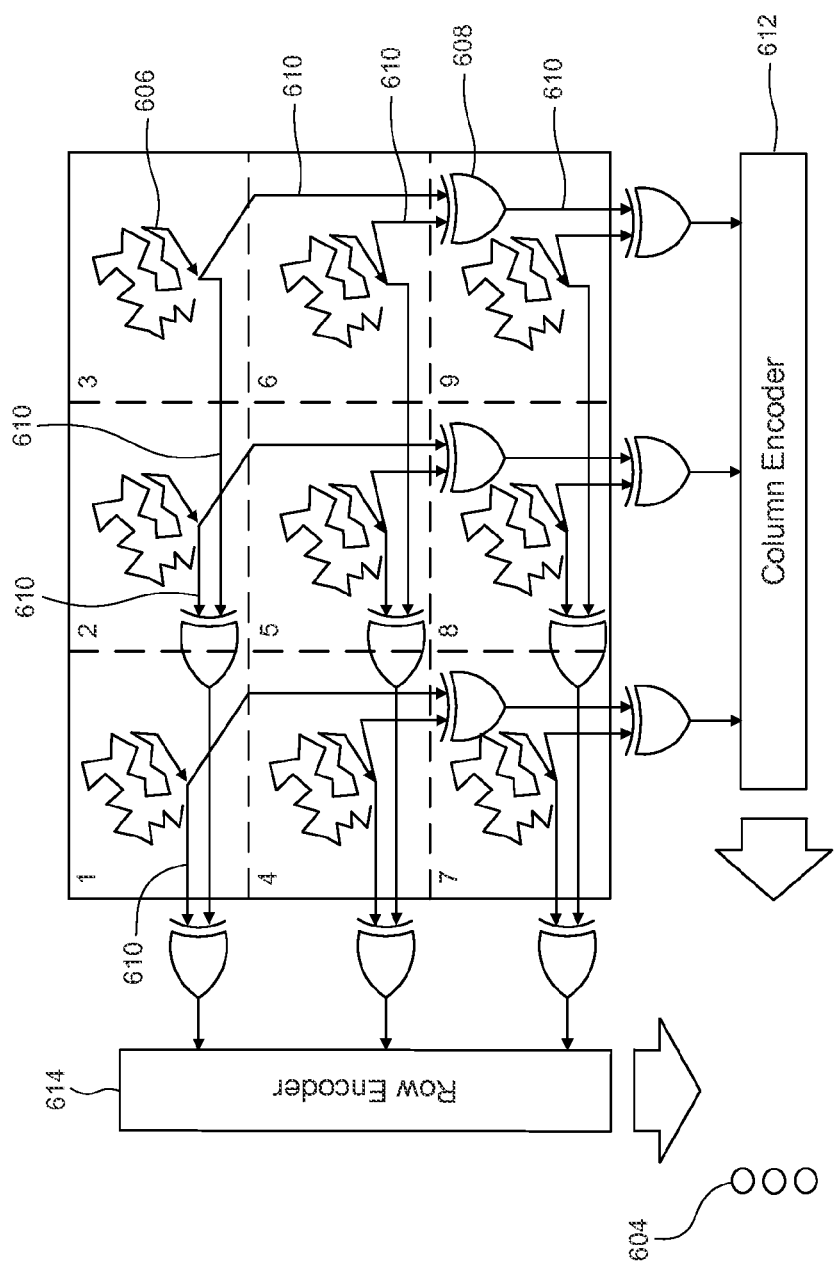
FIG. 6 illustrates an embodiment of an IC having a distributed Compressor as part of its CoDec.

FIG. 6 illustrates an embodiment of an IC having a Compressor as part of its CoDec. In FIG. 6, IC 602 is partitioned into a number of regions (1, 2, 3, 4, 5, 6, 7, 8, 9). The Compressor allows for the IC 602 to be partitioned into a grid of Y by X boxes, with some of the compression logic in each of the boxes. In IC 602 shown in FIG. 6, Y is 3 boxes wide and X is 3 boxes long. In order to implement the Compressor, a first XOR stage is implemented such that the outputs of the scan chains are cascaded. Scan chains are XOR'd with other scan chains. The XOR gates are located on the chip in their respective columns either in between scan chains 610 or proximately located to its associated its scan chain. Starting at one end of the chip, along each column, the scan chains in the column are XOR'd with other scan chains in the same column in a cascading fashion away from the end of the chip. Additional XOR gates are located on the chip in their respective rows either in between scan chains 610 or proximately located to its associated its scan chain. Starting at one end of the chip, the end being next to the end selected for the columns, along each row, the scan chains in the row are XOR'd with other scan chains in the same row in a cascading fashion away from the end of the chip.

As noted in FIG. 6, regions 4, 5, 7, and 8 each contain two XOR gates while regions 1, 2, 6, and 9 each contain a single XOR gate and region 3 contains zero XOR gates. Based on the side selected for the top of the column XOR cascades and the side selected for the top of the row XOR cascades, the locations of the number of XOR gates can be rotated 90 degrees, 180 degrees, or 270 degrees. In an embodiment, the corner that rests between the side selected for the top of the column XOR cascades and the top of the row XOR cascades will be the grid cell without the XOR gates. In an embodiment, the grid cells in contact with the sides selected for the top of the column cascades and the top of the row cascades (with the exception being the corner-most grid cell) will be the grid cells with only one XOR gate.

In an embodiment, the Decompressor of FIG. 5 and the Compressor of FIG. 6 can be used together to provide M scan in pins of test stimuli to N scan chains and then decode the test response data returned from the N scan chains to the M input pins. In an embodiment, the partitioned regions for the Compressor are the same partitioned regions designated for the sequentially distributed Decompressor. In an embodiment, the distributed Decompressor and the Compressor are capable of being used in conjunction as a CoDec.

Figure 7:
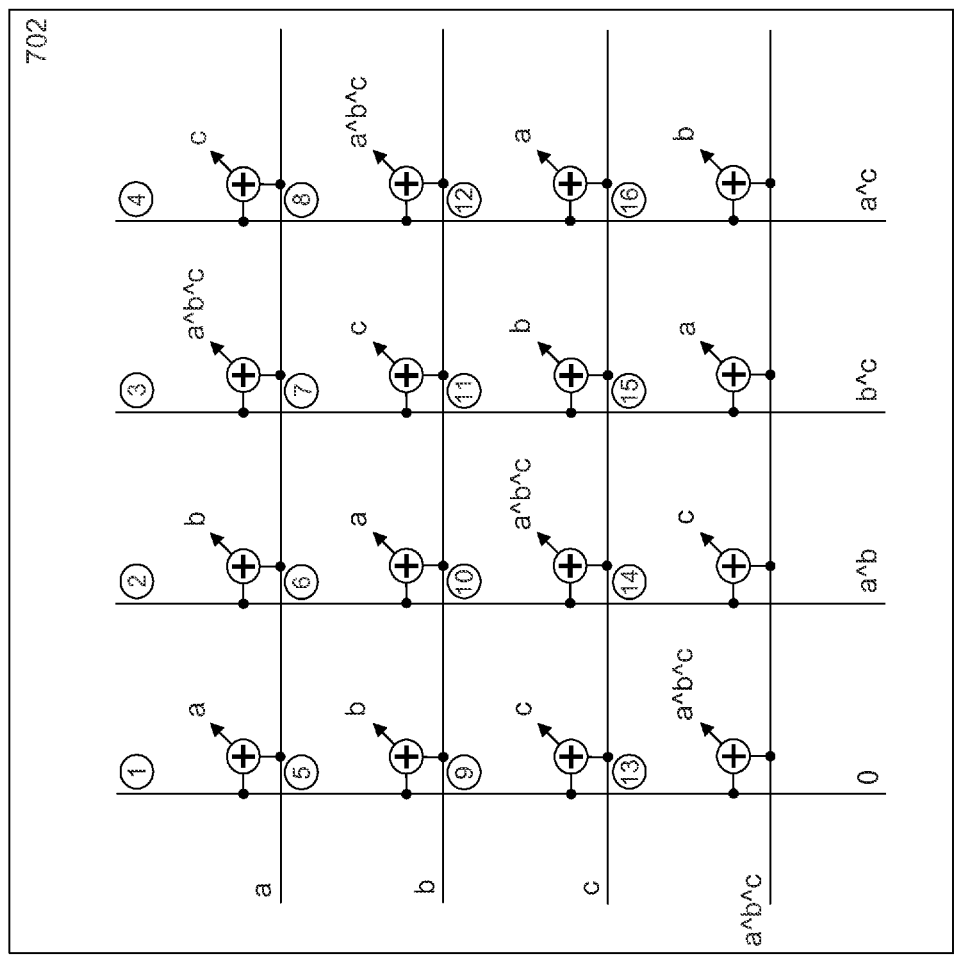
FIG. 7 illustrates the distribution of XOR terms from the DeCompressor to the 2-dimensional IC by a grid-based placement of the XOR gates involved in the decompression logic over the chip area.

FIG. 7 illustrates the distribution of terms from the test stimuli to the 2-dimensional IC by placement of the XOR gates involved in the decompression logic over the chip area. Furthermore, the placement of the XOR gates is strategically structured such that one side of a grid over the chip area receives all of the second set of terms while the other side of the grid over the chip area receives all of the first set of terms. Specifically, as shown in the displayed embodiment of FIG. 7, the second set of terms includes the odd term combinations and the first set of terms includes the even term combinations. In accordance with the decompression method, the terms are spread out along the surface of the IC. The IC is structured such that it is a grid having a set of first axes each extending horizontally and a set of second axes each extending vertically. In an embodiment, the first axes need not be horizontal and the second axes need not be vertical, but the set of first axes and the set of second axes still cross one another.

The specific IC shown in FIG. 7 is structured such that it has 16 grid cells, with 4 columns and 4 rows. Along each of the first axes, the data fed in as the second set of terms includes the odd terms, with one axis for each of the odd data terms. Along each of the second axes, the data fed in as the first set of terms includes all of the even terms, with one axis for each of the even data terms. As shown, the IC 702 includes grid boxes 1 to 16. When there is M input data, N terms are eligible for inclusion in the grid, where N equals $2^m$. As shown in FIG. 7, M input data includes 3 input stimuli: a, b, and c. N equals $2^3$, which is 8, so when the 3 input stimuli are decompressed: there are 8 terms associated with the input data. The 8 terms associated with the input data includes: 0, a, b, c, a^b, b^c, a^c, and a^b^c. From the terms, 4 of the terms are even terms: 0, a^b, b^c, and a^c. From the terms, 4 of the terms are odd terms: a, b, c, and a^b^c.

According to an embodiment, combination of the terms in the final XOR step is performed in a manner to reduce cancellation. By reducing cancellation, the amount of independent data sent into the grid is maximized and the test space is used more efficiently. For example, XORing two even terms: a^b and a^b would result in "0", which when loaded as test data provides no valuable information. By performing the XOR combinations such that one input term into the XOR is always known to be odd, the result from the XOR gate is always odd. When the results of the XORs are always odd, there is no cancellation and there is no wasted data. Furthermore, the XOR of the odd terms and the even terms results in every odd combination—no odd combination is left out. As is shown, the results of the XORs in the grids produce independent data in each of grid sectors 1 to 16. The output from the XOR is fed directly into a scan chain associated with the grid section. In some embodiments, the first set of terms and the second set of terms are selected in a manner that exhibits, similar to the XORing of even terms and odd terms, a tendency to reduce cancellation of terms. In some embodiments, the output from the XOR is fed directly into more than one scan chain associated with the grid section. When more than one scan chain is located in a grid section, the output from the XOR is provided to each scan chain according to a local broadcast.

Selection of all of the second set of terms, shown in FIG. 7 as the odd terms, is performed by selection logic. Similarly, selection of all of the first set of terms, shown in FIG. 7 as the even terms, is performed by selection logic. A point to point, conventional, wire length needed for decompression is $O(N^{3/2})$. The wire length necessitated by the decompression method shown in FIG. 7 is significantly less. For decompression in accordance with the method shown in FIG. 7, the order in which the terms are selected from the second set of terms to be provided to the grid along an axis is not significant. For instance, in an embodiment in which odd terms {a, b, c, a^b^c} are placed along an axis, the relative placement of terms along the axis is insignificant. As an example, only, the first odd term could be c, the second odd term could be a^b^c, the third odd term could be b, and the fourth odd term could be a. As another example, and as shown in FIG. 7, the order of the odd terms could be: a^b^c, c, b, and then a. In some embodiments, the designer could select that the order of the terms in their placement along the grid axis is performed in accordance with a specific algorithm or plan.

The Decompressor can further be set up in a non-symmetric grid where the number of rows does not equal the number of columns. For example, 3 scan inputs may be used to set up an 8×4 grid. In order to generate such a grid, the second set of terms, or the first set of terms, could be repeated over the extra grid area made eligible for selection. If the scan inputs are a, b, c, the resulting channels for the rows in an embodiment using the odd terms would be the set (a, b, c, a^b^c, a, b, c, a^b^c) and the resulting channels for the columns in an embodiment using the even terms would be the set (0, a^b, b^c, a^c). In other embodiments, the channels along the rows could be selected for further expansion. Therefore, if the grid size needs to be increased, according to an embodiment, if $2^p$ is increased then $2^p$ should be increased by an integer factor (e.g., $2*2^p$). According to an embodiment, if $2^q$ is increased, $2^q$ should be increased by an integer factor (e.g., $2*2^q$).

FIG. 8 illustrates an IC input and XOR placement schema of the decompression logic of FIG. 7. FIG. 8 includes an IC implementing the logic described with reference to FIG. 7. However, here further examples are included where the first set of terms is designated to include the even term combinations and the second set of terms is designated to include the odd term combinations.

First, each of the first set of terms, here the even combinations, are delayed by one clock cycle such that the even combinations of terms provided to the XOR gates are from the previous clock cycle. The IC has M scan inputs (1 to 8) 802. After expansion, the M scan inputs result in even terms and odd terms totaling $2^8$. M scan input terms include a, b, c, d, e, f, g, and h. The even terms associated with the M scan input terms are $2^7$, so accordingly, the first set of terms includes the $2^7$ even terms. There are $2^7$ odd terms associated with the M scan input terms, so accordingly, the second set of terms includes the $2^7$ odd terms. According to the selection logic shown along the vertical axis 804, all of the odd terms are selected by selection logic that provides the unique terms to an XOR. The XOR output is then provided to a flop in sequential register array 810.

Each of the terms from the second set of terms is held by one clock cycle after their selection by XORs in the sequential shift register 810. According to the selection logic shown along the horizontal axis 806, all of the even terms are selected by selection logic that provides the unique terms to an XOR. The XOR output is then provided to a flop in a sequential register array 812. Each of the terms provided to the XOR gates from the first set of terms is already delayed by one clock cycle due to delay flops 808. Then, each of the terms from the first set of terms is subjected to one additional delay in the sequential shift register 812.

Due to the delays, each of the terms from the first set of terms experiences a two cycle delay and each of the terms from the second set of terms experiences a one cycle delay. Accordingly, the implementation shown in FIG. 8 demonstrates a two cycle/one cycle delay. In the embodiment shown in FIG. 8, for the first terms along the horizontal axis two delays are implemented: one before the assignment of the generated first terms to the different wires in the set of first wires, and one after the assignment of the generated first terms to the different wires in the first set of wires. For the second terms along the vertical axis the delay is implemented after the assignment of the generated second terms to the different wires in the second set of wires. In an embodiment, the delay register, such as delay register 808, may be a flop for each of the scan inputs. Therefore, for IC with 8 scan inputs 802, after term selection $2^7$ XORs are implemented along axis 806 to generate all of the even terms and $2^7$ XORs are implemented along axis 804 to generate all of the odd terms.

In some embodiments, the XORs and the flops along the horizontal axis may be distributed along a horizontal axis, or near the horizontal axis, of the IC. In some embodiments, the XORs and the flops along the vertical axis are distributed along a vertical axis, or a near the vertical axis, of the IC. The output from the horizontal axis 812 flops is then provided, along the grid, to distributed grid XORs 814. The output from the vertical axis 810 flops is then provided, along the grid, to the distributed grid XORs 814. The output, in each segment of the grid, resembles the output described in FIG. 7. The XORs along the horizontal axis and along the vertical axis are strategically placed in locations to decrease wire length to and from scan chains.

In some embodiments, the XORs along the horizontal axis and along the vertical axis can be moved in order to vary their placement relative to the grid. The XORs along the horizontal axis (e.g., XORs in 812) can be relocated from their displayed positions in FIG. 7 in a direction perpendicular to the horizontal axis (vertically) so that they are in closer proximity to the XOR grid cells. Accordingly, although the XORs along the horizontal axis are shown on the bottom side of the grid, they could instead be placed along the top side of the grid. The XORs along the vertical axis (e.g., XORs in 810) can be relocated from their displayed positions in FIG. 7 in a direction perpendicular to the vertical axis (horizontally) so that they are in closer proximity to the XOR grid cells. Accordingly, although the XORs along the vertical axis are shown on the left hand side of the grid, they could instead be placed along the right hand side of the grid.

For convenience, the distance between the flops in the sequential shift layer along the vertical axis of the grid is minimized. Similarly, the distance between the flops in the sequential shift layer along the horizontal axis of the grid is minimized. In some embodiments, the distance between the flops in the sequential shift layers, either along the vertical axis of the grid or along the horizontal axis of the grid, is set according to a designer's choice.

Similarly, the XORs within the grids are placed strategically in order to decrease wire length to and from the scan chains. In an embodiment, the XORs within the grid cells may be placed in the center of the cell. In some embodiments, the XORs within the grid cells are selected to be in close proximity to the scan chain on the IC. In some embodiments, the XORs within the grid cells are selected according to a designer's location selection within each grid cell. In an embodiment, the XORs within the grid cells may be placed in a location most central to all of the different heads of the scan chains.

Figure 9:
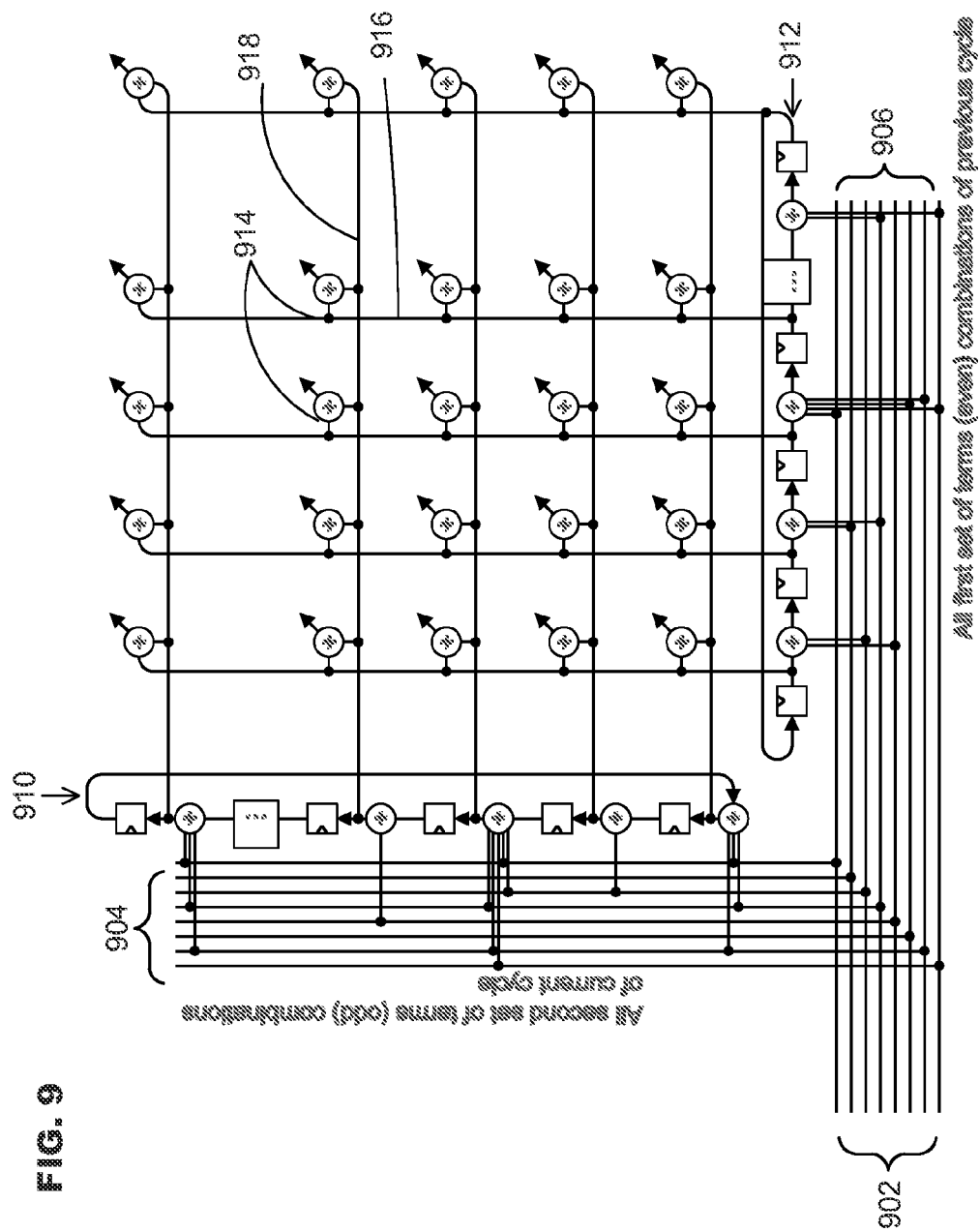
FIG. 9 illustrates an alternative IC input and XOR placement schema of the decompression logic of FIG. 7.

FIG. 9 illustrates an IC input and XOR placement schema of the decompression logic of FIG. 7 that is an alternative to FIG. 8. FIG. 9 includes another IC capable of implementing the logic described with reference to FIG. 7. The IC has M scan inputs (1 to 8) 902. After expansion, the M scan inputs result in even terms and odd terms totaling $2^8$. M scan input terms include a, b, c, d, e, f, g, and h. The even terms associated with the M scan input terms are $2^7$, so accordingly, the first set of terms includes the $2^7$ even terms. There are $2^7$ odd terms associated with the M scan input terms, so accordingly, the second set of terms includes the $2^7$ odd terms. According to the selection logic shown along the vertical axis 904, all of the odd terms are selected by selection logic that provides the unique terms to an XOR. The XOR output is then provided to a flop in sequential register array 910. The XOR output is then directly, without delay, provided to the distributed grid XORs 914. According to the selection logic shown along the horizontal axis 906, all of the even terms are selected by selection logic that provides the unique terms to an XOR. The XOR output is then provided to a flop in a sequential register array 912. Then, each of the terms from the first set of terms is held by one clock cycle after their selection by XORs in the sequential shift register 912 (note: as shown, FIG. 9 does not include equivalents to delay flops 808). Only then is the once delayed XOR output provided to the distributed XOR gates 914. The result is that each of the terms from the first set of terms experiences a one cycle delay and that each of the terms from the second set of terms experiences a zero cycle delay. Accordingly, the implementation shown in FIG. 9 demonstrates a zero cycle/one cycle delay. In the embodiment shown in FIG. 9, for the first terms along the horizontal axis one delay is implemented after the assignment of the generated first terms to the different wires in the first set of wires. For the second terms along the vertical axis, no delay is implemented because the grid wires provide term data directly to the grid before the delay elements. In an embodiment, the delay registers, such as each of the delay registers in the sequential shift register 912 and the sequential shift register 910, may be a flop for each of the scan inputs. Therefore, for IC with 8 scan inputs 902, after term selection $2^7$ XORs are implemented along axis 906 to generate all of the first set of terms and $2^7$ XORs are implemented along axis 904 to generate all of the second set of terms.

In some embodiments, the XORs and the flops along the horizontal axis may be distributed along a horizontal axis, or near the horizontal axis, of the IC. In some embodiments, the XORs and the flops along the vertical axis are distributed along a vertical axis, or near the vertical axis, of the IC. The output from the horizontal axis 912 flops is then provided, along the grid, to distributed grid XORs 914. The output from the vertical axis 910 flops is then provided, along the grid, to the distributed grid XORs 914. The output, in each segment of the grid, resembles the output described in FIG. 7.

Figure 10:
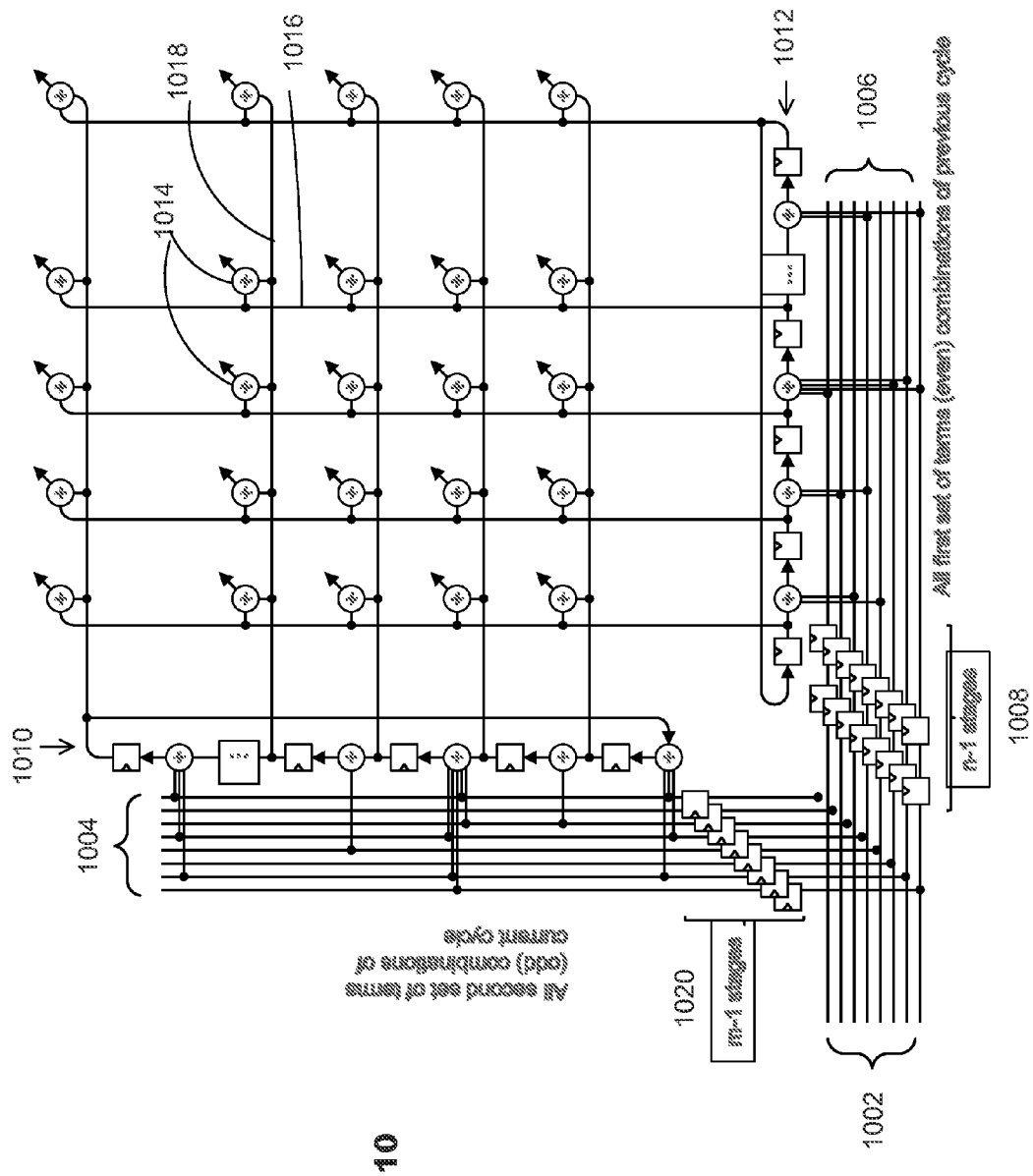
FIG. 10 illustrates an alternative IC input and XOR placement schema of the decompression logic of FIG. 7.

FIG. 10 illustrates an IC input and XOR placement schema of the decompression logic of FIG. 7 that is an alternative to FIG. 8. FIG. 10 includes another IC capable of implementing the logic described with reference to FIG. 7. The IC has M scan inputs (1 to 8) 1002. After expansion, the M scan inputs result in even terms and odd terms totaling $2^8$. M scan input terms include a, b, c, d, e, f, g, and h. The even terms associated with the M scan input terms are $2^7$, so accordingly, the first set of terms includes the $2^7$ even terms. There are $2^7$ odd terms associated with the M scan input terms, so accordingly, the second set of terms includes the $2^7$ odd terms. According to the selection logic shown along the vertical axis 1004, all of the odd terms are selected by selection logic that provides the unique terms to an XOR. The XOR output is then provided to a flop in sequential register array 1010. According to the selection logic shown along the horizontal axis 1006, all of the even terms are selected by selection logic that provides the unique terms to an XOR. The XOR output is then provided to a flop in a sequential register array 1012. In FIG. 8, each of the terms from the first set of terms were held by one clock cycle in a delay from delay flops 808, and then were each held by one additional delay after their selection by XORs in the sequential shift register 812. Instead, in FIG. 10, each of the terms from the first set of terms is held by n−1 clock cycle stages in delays from associated delay flops 1008, and then each are held by one additional delay after their selection by XORs in the sequential shift register 1012. Also in FIG. 10, each of the terms from the second set of terms is held by m−1 clock cycle stages in delays from associated delay flops 1020, and then each are held by one additional delay after their selection by XORs in the sequential shift register 1010. The result is that each of the terms from the second set of terms experiences an m cycle delay and that each of the terms from the first set of terms experiences an n cycle delay. Accordingly, the implementation shown in FIG. 10 demonstrates an n cycle/m cycle delay. In the embodiment shown in FIG. 10, for the first terms along the horizontal axis: one delay of n−1 clock cycles is implemented before the assignment of the generated first terms to the different wires in the first set of wires, and another delay is implemented after the assignment of the generated first terms to the different wires in the first set of wires. For the second terms along the vertical axis: one delay of m−1 clock cycles is implemented before the assignment of the second terms to the different wires in the second set of wires, and another delay is implemented after the assignment of the generated second terms to the different wires in the second set of wires. In some embodiments, the delay on both axes is the same. In other embodiments, the delay on the first axis is different than the delay on the second axis. In an embodiment, the delay registers, such as each of the delay registers in the sequential shift register 1012 and in the sequential shift register 1010, may be a flop for each of the scan inputs. Therefore, for IC with 8 scan inputs 1002, after term selection $2^7$ XORs are implemented along axis 1006 to generate all of the first set of terms and $2^7$ XORs are implemented along axis 1004 to generate all of the second set of terms.

In some embodiments, the XORs and the flops along the horizontal axis may be distributed along a horizontal axis, or near horizontal axis, of the IC. In some embodiments, the XORs and the flops along the vertical axis are distributed along a vertical axis, or a near vertical axis, of the IC. The output from the horizontal axis 1012 flops is then provided, along the grid, to distributed grid XORs 1014. The output from the vertical axis 1010 flops is then provided, along the grid, to the distributed grid XORs 1014. The output, in each segment of the grid, resembles the output described in FIG. 7.

Figure 11:
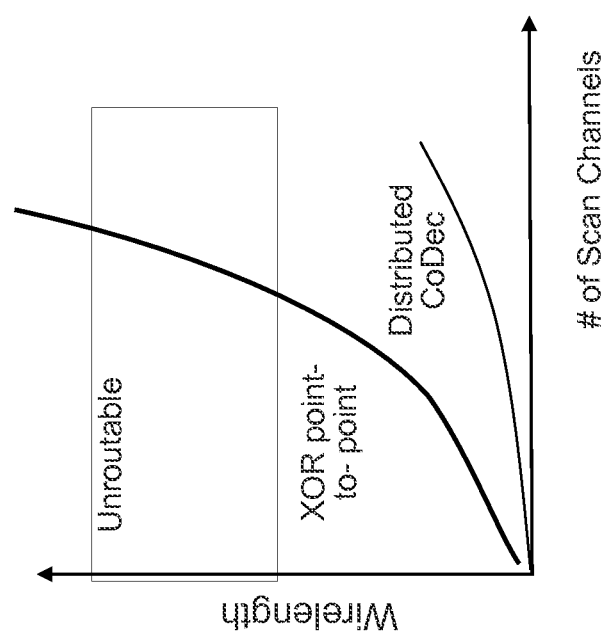
FIG. 11 illustrates the difference in wire length (along the Y-axis) to the number of scan channels (along the X-axis) when a Decompressor is wired using XOR point-to-point versus a distributed Decompressor as described herein.

FIG. 11 illustrates the difference in wire length (along the Y-axis) to the number of scan channels (along the X-axis) when a Decompressor is wired using XOR point-to-point versus a distributed Decompressor as described herein. As shown, as the number of scan channels increases, the global implementation (or point to point implementation) of wiring increases exponentially into the unroutable area while with the sequentially distributed decompression XORs, the amount of wiring needed increases relatively slowly.

Figure 12:
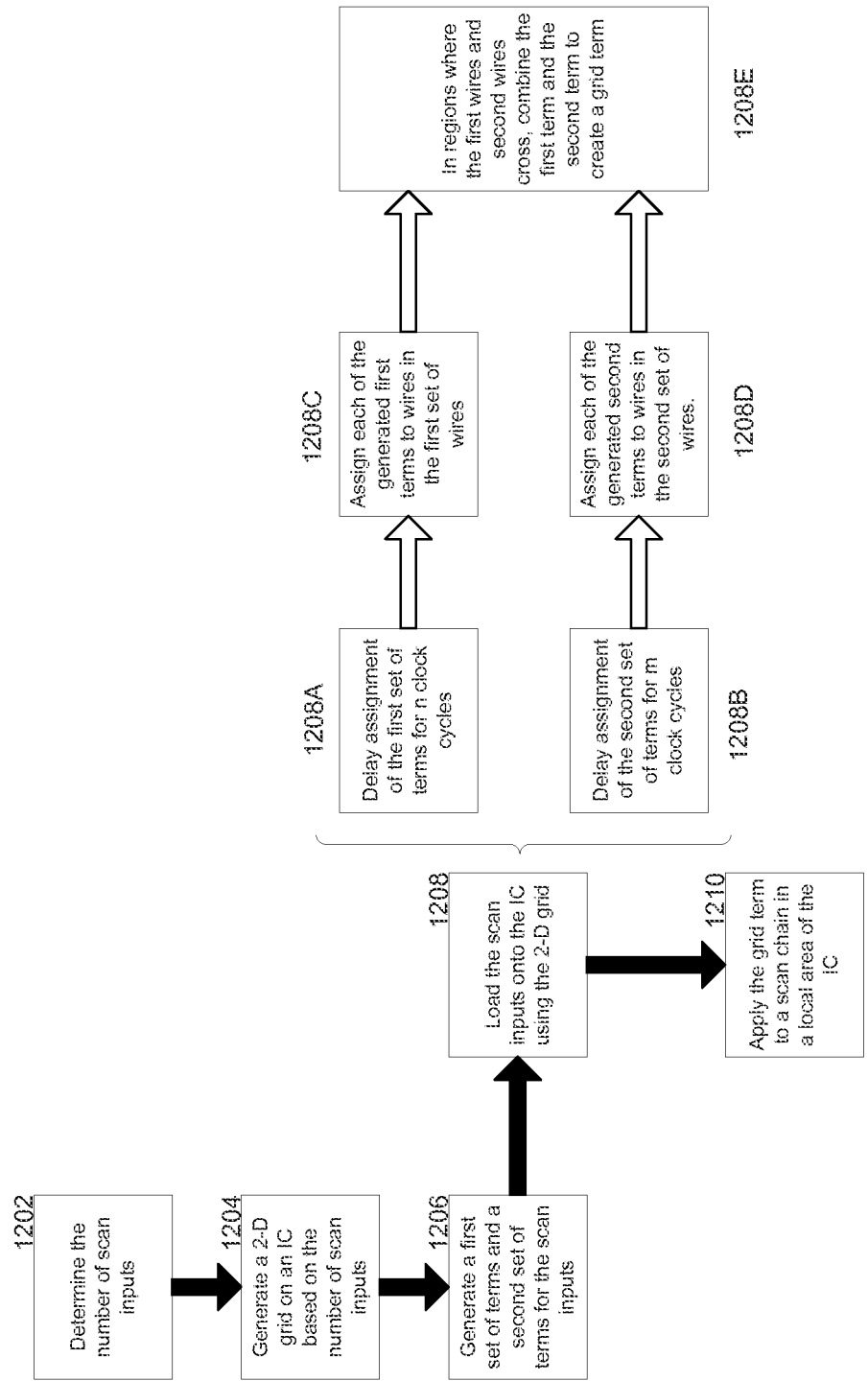
FIG. 12 illustrates a method for decompressing a set of scan inputs to a design for test circuit.

FIG. 12 illustrates a method for decompressing a set of scan inputs to a design for test circuit. At 1202, the number of scan inputs is determined. In some embodiments, 1202 further includes determining the compression ratio and the delay values. The compression ratio is according to a user's desired compression ratio or the needs of a particular application. The delay values represent the number of clock cycles that the compression is delayed along each of a first dimension of a grid and along a second dimension of a grid. The delay values, when provided as input, can be represented as (n,m), where "n" is the number of clock cycles that the compression is delayed along the first dimension of the grid and "m" is the number of clock cycles that the compression is delayed along the second dimension of the grid.

The delay values can be implemented either by: 1) adding n/m flop delay stages along the scan inputs split along the first set of wires or along the scan inputs split along the second set of wires (i.e., "pipeline" flops for each scan input) or 2) altering the location of the selection of the terms from the cyclic shift register. For example, the location of the selection of the terms for the cyclic shift register varies between the embodiments shown in FIG. 9 and FIG. 10. In FIG. 9, terms are immediately applied to the grid after their respective XOR stages in the sequential shift register 910. In contrast, in FIG. 10, terms are held for one additional clock cycle in respective flop delay stages after their respective XOR stages in the sequential shift register 1010.

If either of n or m is a "0", then no delay is provided. To provide no delay, no flop delay stages are added to the generated terms (i.e., the generated first terms or the generated second terms) and the terms are immediately applied to the grid after their respective XOR stages (as shown in sequential shift register 910 of FIG. 9). If either of n or m is a "1", then a single delay is added by one of: i) holding the terms for one additional clock cycle in respective flop delay stages after their respective XOR stages in the sequential shift register (as shown in FIG. 10) or ii) adding flop delay stages along the terms.

At 1204, a 2-dimensional grid is generated on an integrated circuit. The grid includes a number of grid cells, N, that is equal to the number of scan inputs multiplied by the compression ratio (N=# of scan inputs*compression ratio). Each grid cell should include the same number of scan elements or a similar number of scan elements. In some embodiments, the dimensions of the grid are even (e.g., 20 grid cells by 20 grid cells). In some embodiments, the dimensions of the grid are odd (e.g., 19 grid cells by 21 grid cells). In some embodiments, the 2-dimensional grid may be generated such that it has a set of first wires, each wire in the set of first wires extending along a first dimension of the grid, and a set of second wires, crossing the set of first wires, each wire in the set of second wires extending along a second dimension of the grid.

At 1206, a first set of term combinations and a second set of term combinations are generated for the provided scan inputs. In some embodiments, the scan inputs are included in the first set of term combinations and the second set of term combinations such that they are used for roughly half the number of total combinations. The scan inputs are included in the first set of term combinations and the second set of term combinations so that the same combinations are repeated as infrequently as possible. In some embodiments, one of the first set of term combinations and the second set of term combinations includes at least one "0" value term combination. In some embodiments, the first set of terms are the even term combinations and the second set of terms are the odd term combinations.

At 1208, the set of scan inputs is loaded onto the integrated circuit using the 2-dimensional grid. As a first part of 1208 (in 1208A), assignment of the first set of terms is optionally delayed for n clock cycles. Also a first part of 1208 (in 1208B), assignment of the second set of terms is optionally delayed for m clock cycles. 1208A and 1208B can be executed sequentially or in parallel. At 1208C, each of the generated first terms is assigned to different wires in the set of first wires. At 1208D, each of the generated second terms is assigned to different wires in the set of second wires. 1208C and 1208D each follow a respective optional delay (e.g., 1208A and 1208B), and therefore may or may not be executed at the same time. Two circular shift registers are implemented to assist in the assignment of the generated first terms and the generated second terms to the grid cells. The first of the circular shift registers is used to feed the generated first terms onto the set of first wires. The second of the circular shift registers is used to feed the generated second terms onto the set of second wires. The length of the circular shift registers is determined by the dimensions of the grid. As an example, if the grid has 400 grid cells, the dimensions of the grid are 20 cells by 20 cells. Accordingly, each of the circular shift registers would interact with a respective one of the set of first wires and the set of second wires at 20 different locations. The 20 different locations would each be associated with a delay element along the circular shift register. At 1208E, which follows 1208C and 1208D, in each region where a wire in the set of first wires crosses a wire in the set of second wires: the second term assigned to a respective second wire and the even term assigned to a respective first wire are combined to create a grid term. In an embodiment, the second terms and first terms are combined in pairs, in each instance by an XOR gate.

At 1210, the grid term is applied to a scan chain in a local area of the IC.

Some of the foregoing embodiments refer to algorithms, sequences, macros, and operations that require execution of instructions and the usage of a memory. Execution of the instructions stored in memory may be performed by a processing device of an apparatus, the processing device specific to the apparatus. The apparatus hosting the processing device may be in some circumstances the ATE, or in other circumstances, the IC. The processing device executes, or selectively activates in order to execute, a computer program. The computer program is stored in memory associated with the apparatus. Memory available on the apparatus may include a computer readable storage medium, which is not limited to, but may include, any type of disk, including floppy disks, optical disks, CD-ROMs, magnetic-optical disks, read-only memories (ROMs), random access memories (RAMs), electrically erasable programmable read-only memory (EEPROM), flash memory, magnetic or optical cards, or an type of media that stores electronic instructions. Each of the memory devices implemented in the apparatus is further connected to or coupled to a system bus or a network connection, wired or unwired, capable of facilitating or driving communications.

In the foregoing Description of Embodiments, various features are grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A method for decompressing a set of scan inputs to a design for test circuit, the method comprising:
   determining a number of scan inputs in the set of scan inputs;
   generating a 2-dimensional grid on an integrated circuit, the 2-dimensional grid including:
      a set of first wires, each wire in the set of first wires extending along a first dimension of the grid, and
      a set of second wires, crossing the set of first wires, each wire in the set of second wires extending along a second dimension of the grid;
   generating a first set of terms and a second set of terms for the set of scan inputs;
   loading the set of scan inputs onto the integrated circuit using the 2-dimensional grid by:
      assigning each of the generated first set of terms to different wires in the set of first wires,
      assigning each of the generated second set of terms to different wires in the set of second wires, and
      in each region where a wire in the set of first wires crosses a wire in the set of second wires:
         combining a term from the second set of terms assigned to the wire in the set of second wires with a term from the first set of terms assigned to the wire in the set of first wires into a grid term, and
         applying the grid term to a local area of the integrated circuit.

2. The method of claim 1, wherein the first set of terms are even terms and the second set of terms are odd terms.

3. The method of claim 2, wherein the number of scan inputs in the set of scan inputs is N, wherein $2^{N-1}$ even terms and $2^{N-1}$ odd terms are generated, and wherein a number of wires in each of the set of first wires and the set of second wires is $2^{N-1}$.

4. The method of claim 1, wherein combining the second term from the wire in the second set of wires with the first term from the wire in the first set of wires into the grid term is performed by:
   providing the second term and the first term as input to an exclusive OR (XOR) gate, and
   receiving the grid term as output from the XOR gate.

5. The method of claim 1, further comprising:
   delaying, by a clock cycle, one of: (i) the generated first set of terms before assigning each of the generated terms from the first set of terms to different wires in the set of first wires, and (ii) the generated second set of terms before assigning each of the generated terms from the second set of terms to different wires in the set of second wires.

6. The method of claim 1, wherein the assigning of the generated first set of terms includes:
   applying the set of scan inputs to a first set of exclusive OR (XOR) gates, such that the output of the set of XOR gates includes all of the first set of terms;
   collecting the output from the first set of XOR gates in a first cyclic shift register, and
   latching the collected output from the first cyclic shift register onto the set of first wires on the 2-dimensional grid, and
   wherein the assigning of the generated second set of terms includes:
      applying the set of scan inputs to a second set of XOR gates, such that the output of the second set of XOR gates includes all of the second set of terms;
      collecting the output from the second set of exclusive OR (XOR) gates in a second cyclic shift register, and
      latching the collected output from the second cyclic shift register onto the set of second wires on the 2-dimensional grid.

7. The method of claim 6, wherein the latching the collected output from the first cyclic shift register is implemented by one of: driving the output from the first set of XOR gates onto the set of first wires on the 2-dimensional grid, and driving the output from a first set of memory elements associated with the first set of XOR gates onto the first set of wires on the 2-dimensional grid, and
   wherein the latching of the collected output from the second cyclic shift register is implemented by one of: driving the output from the second set of XOR gates onto the set of second wires on the 2-dimensional grid, and driving the output from a second set of memory elements associated with the second set of XOR gates onto the second set of wires on the 2-dimensional grid.

8. The method of claim 6, wherein each of the first cyclic shift register and the second cyclic shift register is one of: a first-in, first-out (FIFO) cyclic shift register and a pseudo-random pattern generator shift register (PRPG).

9. A design for test integrated circuit capable of decompressing a set of scan inputs for a test, the design for test integrated circuit comprising:
   a 2-dimensional grid having a first set of wires, each wire in the first set of wires extending along a first dimension of the grid, and a second set of wires that crosses the set of first wires, each wire in the second set of wires extending along a second dimension of the grid;
   selection logic that:
      generates a first set of terms and a second set of terms from the set of scan inputs,
      assigns each of the generated terms from the first set of terms to different wires in the first set of wires, and
      assigns each of the generated terms from the second set of terms to different wires in the second set of wires;
   a set of exclusive OR (XOR) gates, each XOR gate from the set of XOR gates placed in a different region of the integrated circuit in which a wire in the first set of wires crosses a wire in the second set of wires, and each XOR gate input connected to: (i) the wire in the second set of wires and (ii) the wire in the first set of wires, and each XOR gate output connected to at least one scan chain.

10. The design for test integrated circuit of claim 9, wherein the first set of terms includes even terms and the second set of terms includes odd terms.

11. The design for test integrated circuit of claim 10, wherein the number of scan inputs in the set of scan inputs is N, wherein $2^{N-1}$ even terms and $2^{N-1}$ odd terms are generated, and wherein a number of wires in each of the set of first wires and the set of second wires is $2^{N-1}$.

12. The design for test integrated circuit of claim 9, wherein the selection logic includes:
a second set of exclusive OR (XOR) gates that:
  receive the set of scan inputs, and
  generate the first set of terms from the set of scan inputs; and
a third set of exclusive OR (XOR) gates that:
  receive the set of scan inputs, and
  generate the second set of terms from the set of scan inputs.

13. The design for test integrated circuit of claim 12, wherein the selection logic further includes:
a first cyclic shift register that:
  collects the output from the second set of XOR gates, and
  latches the collected output onto the first set of wires on the 2-dimensional grid; and
a second cyclic shift register that:
  collects the output from the third set of XOR gates, and
  latches the collected output onto the second set of wires on the 2-dimensional grid.

14. The design for test integrated circuit of claim 13, wherein each of the first cyclic shift register and the second cyclic shift register is one of: a first-in, first-out (FIFO) cyclic shift register and a pseudo-random pattern generator shift register (PRPG).

15. The design for test integrated circuit of claim 13, wherein the first cyclic shift register latches the collected output onto the first set of wires by one of: driving the output from the second set of XOR gates onto the set of first wires on the 2-dimensional grid, and driving the output from a first set of memory elements associated with the second set of XOR gates onto the first set of wires on the 2-dimensional grid, and
wherein the second cyclic shift register latches the collected output onto the second set of wires by one of: driving the output from the third set of XOR gates onto the set of second wires on the 2-dimensional grid, and driving the output from a second set of memory elements associated with the third set of XOR gates onto the second set of wires on the 2-dimensional grid.

16. The design for test integrated circuit of claim 9, further comprising:
a set of delay flops connected to the selection logic, the set of delay flops delaying the set of scan inputs before only one of the generation of the first set of terms and generation of the second set of terms.

17. A system for decompressing a set of scan inputs, comprising:
a 2-dimensional grid having a first set of wires, each wire in the first set of wires extending along a first dimension of the grid, and a second set of wires that crosses the first set of wires, each wire in the second set of wires extending along a second dimension of the grid;
a design for test integrated circuit in a plane parallel to the 2-dimensional grid, the design for test integrated circuit having:
  a set of XOR gates, with each XOR gate from the set of XOR gates in a different region of the integrated circuit parallel to locations on the 2-dimensional grid in which a wire from the first set of wires crosses a wire in the second set of wires, with each XOR gate input connected to: (i) the wire in the second set of wires and (ii) the wire in the first set of wires, and
  at least one scan chain associated with each XOR gate output; and
  selection logic driving: (i) each term of a first set of terms associated with the set of scan inputs to different wires in the first set of wires, and (ii) each term of a second set of terms associated with the set of scan inputs to different wires in the second set of wires.

18. The system of claim 17, wherein the 2-dimensional grid is overlaid onto the design for test integrated circuit.

19. The system of claim 17, wherein the selection logic includes:
a second set of exclusive OR (XOR) gates that:
  receive the set of scan inputs, and
  generate all even terms from the set of scan inputs;
a third set of exclusive OR (XOR) gates that:
  receive the set of scan inputs, and
  generate all odd terms from the set of scan inputs;
a first cyclic shift register that:
  collects the output from the second set of XOR gates, and
  latches the collected output onto the first set of wires on the 2-dimensional grid; and
a second cyclic shift register that:
  collects the output from the third set of XOR gates, and
  latches the collected output onto the second set of wires on the 2-dimensional grid.

20. The system of claim 17, wherein the first set of terms includes even terms and the second set of terms includes odd terms.

* * * * *